(12) United States Patent
Hiemstra et al.

(10) Patent No.: US 12,347,740 B2
(45) Date of Patent: Jul. 1, 2025

(54) POWER AMPLIFIER MODULE WITH TRANSISTOR DIES FOR MULTIPLE AMPLIFIER STAGES ON A SAME HEAT DISSIPATION STRUCTURE

(71) Applicant: NXP USA, Inc., Austin, TX (US)

(72) Inventors: Stephen Reza Hiemstra, Gilbert, AZ (US); Lu Wang, Chandler, AZ (US); Joshua Bennett English, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 468 days.

(21) Appl. No.: 18/062,087

(22) Filed: Dec. 6, 2022

(65) Prior Publication Data

US 2024/0186212 A1     Jun. 6, 2024

(51) Int. Cl.
*H01L 23/367* (2006.01)
*H01L 23/00* (2006.01)
(Continued)

(52) U.S. Cl.
CPC .......... *H01L 23/3675* (2013.01); *H01L 23/66* (2013.01); *H01L 24/32* (2013.01);
(Continued)

(58) Field of Classification Search
CPC . H01L 23/3675; H01L 23/66; H01L 23/5385; H01L 23/13; H01L 23/36; H01L 23/4334; H01L 23/3677; H01L 23/3672; H01L 23/3121; H01L 23/481; H01L 23/5283; H01L 23/5386; H01L 2223/6611; H01L 2223/6616; H01L 2223/665; H01L 2223/6655; H01L 2223/6672; H01L 2223/6677; H01L 2223/6661; H01L 2223/6644; H01L 24/32; H01L 24/48; H01L 24/73; H01L 2224/32245; H01L 2224/48195; H01L 2224/48225; H01L 2224/73265; H01L 2924/1421; H01L 2924/2027; H01L 2924/30107;
(Continued)

(56) References Cited

U.S. PATENT DOCUMENTS 9,774,301 B1   9/2017   Maalouf et al.
10,903,182 B1  1/2021   Wang et al.
(Continued)

*Primary Examiner* — Brigitte A Paterson
(74) *Attorney, Agent, or Firm* — Sherry W. Gourlay

(57) ABSTRACT

A power amplifier module includes a module substrate. First and second heat dissipation structures extend through the module substrate, and each has a first surface exposed at a mounting surface of the module substrate, and a second surface exposed at a bottom surface of the module substrate. The first surfaces of the first and second heat dissipation structures are physically separated by a portion of the mounting surface. First and second amplifier dies are coupled to the first surface of the first heat dissipation structure. The first amplifier die includes a first power transistor that functions as a driver amplifier. The second amplifier die includes a second power transistor that functions as a first final amplifier. The third amplifier die is coupled to the first surface of the second heat dissipation structure, and the third amplifier die includes a third power transistor that functions as a second final amplifier.

19 Claims, 6 Drawing Sheets

(51) Int. Cl.
  *H01L 23/66* (2006.01)
  *H01L 25/07* (2006.01)
  *H01L 25/16* (2023.01)
  *H03F 1/02* (2006.01)
  *H03F 3/195* (2006.01)
  *H03F 3/60* (2006.01)

(52) U.S. Cl.
  CPC .............. *H01L 24/48* (2013.01); *H01L 24/73* (2013.01); *H01L 25/072* (2013.01); *H01L 25/165* (2013.01); *H03F 1/0288* (2013.01); *H03F 3/195* (2013.01); *H03F 3/604* (2013.01); *H01L 2223/6611* (2013.01); *H01L 2223/6616* (2013.01); *H01L 2223/665* (2013.01); *H01L 2223/6655* (2013.01); *H01L 2223/6672* (2013.01); *H01L 2223/6677* (2013.01); *H01L 2224/32245* (2013.01); *H01L 2224/48195* (2013.01); *H01L 2224/48225* (2013.01); *H01L 2224/73265* (2013.01); *H01L 2924/1421* (2013.01); *H01L 2924/2027* (2013.01); *H01L 2924/30107* (2013.01); *H01L 2924/30111* (2013.01); *H03F 2200/451* (2013.01)

(58) Field of Classification Search
  CPC ......... H01L 2924/30111; H01L 25/072; H01L 25/165; H03F 1/0288; H03F 3/195; H03F 3/604; H03F 2200/411; H05K 1/0204
  See application file for complete search history.

(56) References Cited

U.S. PATENT DOCUMENTS

| | | |
|---|---|---|
| 11,145,609 B2 | 10/2021 | Schultz et al. |
| 2012/0218044 A1 | 8/2012 | Jeong et al. |
| 2018/0013391 A1 | 1/2018 | Maalouf et al. |
| 2022/0130768 A1 | 4/2022 | Wei et al. |
| 2022/0208646 A1 | 6/2022 | Low et al. |
| 2022/0208670 A1* | 6/2022 | Jones ................. H03F 3/213 |

* cited by examiner

US 12,347,740 B2

POWER AMPLIFIER MODULE WITH TRANSISTOR DIES FOR MULTIPLE AMPLIFIER STAGES ON A SAME HEAT DISSIPATION STRUCTURE

TECHNICAL FIELD

Embodiments of the subject matter described herein relate generally to circuit modules, and more particularly to Doherty power amplifier modules.

BACKGROUND

Wireless communication systems employ power amplifier modules for increasing the power of radio frequency (RF) signals. A power amplifier module includes a module substrate and amplifier circuitry coupled to a mounting surface of the module substrate. The amplifier circuitry often includes a power transistor die, which has at least one integrated power transistor with a bottom-side conductive ground layer. This bottom-side conductive ground layer may be connected to a ground/heat dissipation structure, which may extend through the module substrate between the mounting surface and the bottom surface of the substrate.

During operation, the power transistor amplifies input RF signals to produce amplified output RF signals. All the while, heat generated by the power transistor die is conveyed through the ground/heat dissipation structure embedded in the module substrate to, for example, a system heat spreader. Along with functioning to remove heat from the power transistor die, the ground/heat dissipation structure may function to provide a ground reference to the power transistor die.

As wireless communication systems continue to evolve, increasing emphasis is placed on providing higher power amplifiers while simultaneously reducing the amplifier footprint. However, increasing power levels while reducing amplifier size results in increasingly difficult-to-solve thermal challenges.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter described herein include power amplifier modules that include multiple-stage power amplifiers (i.e., "multiple-stage power amplifier modules"). The power amplifier module includes a module substrate with a mounting surface, one or more embedded heat dissipation structures that extend through the module substrate, and multiple power amplifier dies, which are connected to the embedded heat dissipation structure(s). In a particular embodiment, the power amplifier module includes a multiple-stage power amplifier with a driver amplifier die and a final stage amplifier die, where the driver amplifier die and the final stage amplifier die are coupled to the same embedded heat dissipation structure. According to a further embodiment, the driver amplifier die and the final stage amplifier die are coupled to the same embedded heat dissipation structure in an orthogonal orientation. This configuration enables compact power amplifier modules that are capable of operating at increasingly high power levels while simultaneously addressing thermal challenges associated with such higher power operation.

The multiple-stage power amplifier module embodiments described herein may be utilized to implement any of a variety of different types of power amplifiers. To provide a concrete example that will help to convey the details of the inventive subject matter, an example of a Doherty power amplifier module is described herein, which includes a driver amplifier stage, which is coupled through a power splitter to final carrier and peaking amplifier stages. However, those of skill in the art will understand, based on the description herein, that the inventive subject matter may be utilized in power amplifier modules that implement other types of multiple-stage amplifiers, as well. Accordingly, the use of a Doherty power amplifier in the example embodiments below is not meant to limit application of the inventive subject matter only to Doherty power amplifier modules, as the inventive subject matter may be used in other types of multiple-stage power amplifier modules, as well.

Figure 1:
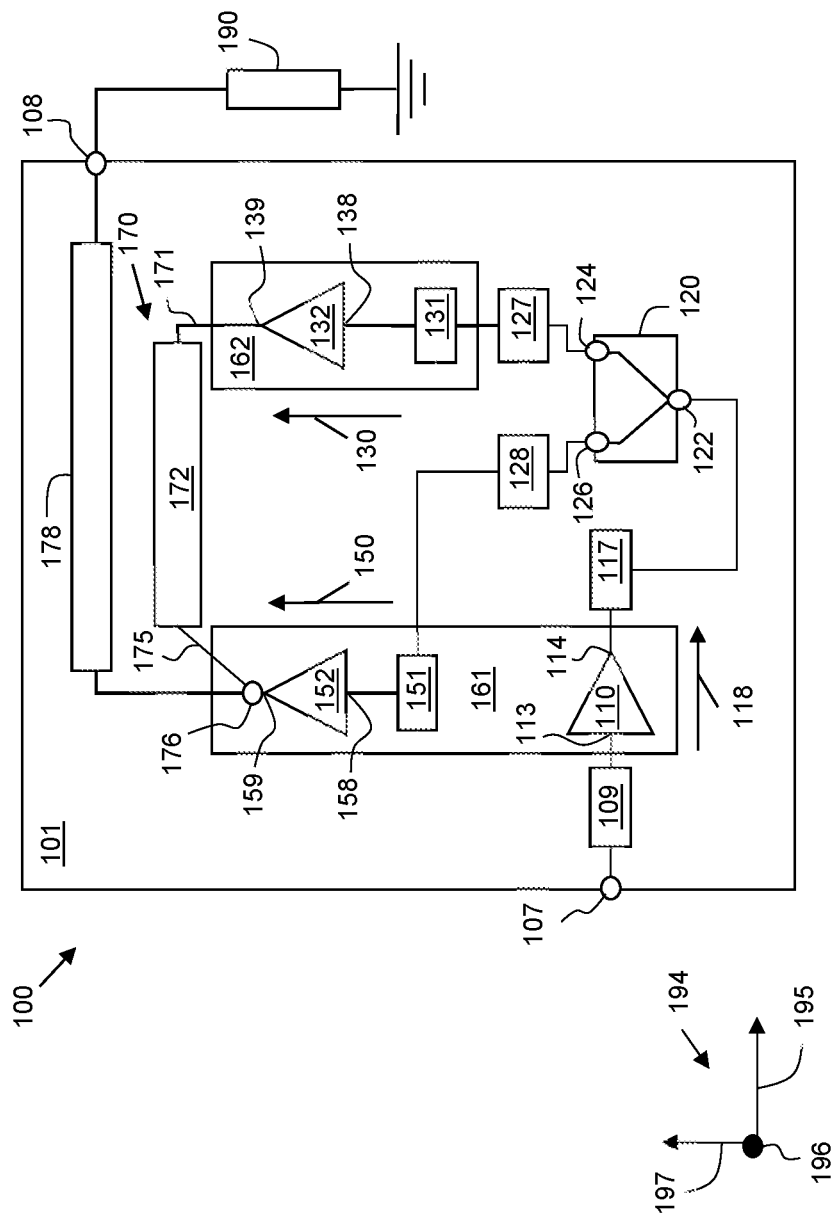
FIG. 1 is a schematic depiction of a Doherty power amplifier in a power amplifier module.

Prior to describing various physical implementations of power amplifier modules, reference is made to FIG. 1, which is a schematic depiction of a Doherty power amplifier implemented in a power amplifier module 100. To better describe the relative orientations of various elements of the illustrated embodiments, a Cartesian coordinate system 194 with orthogonal axes 195, 196, 197 is depicted in the lower right corner of FIG. 1, and also in other Figures.

Figure 2:
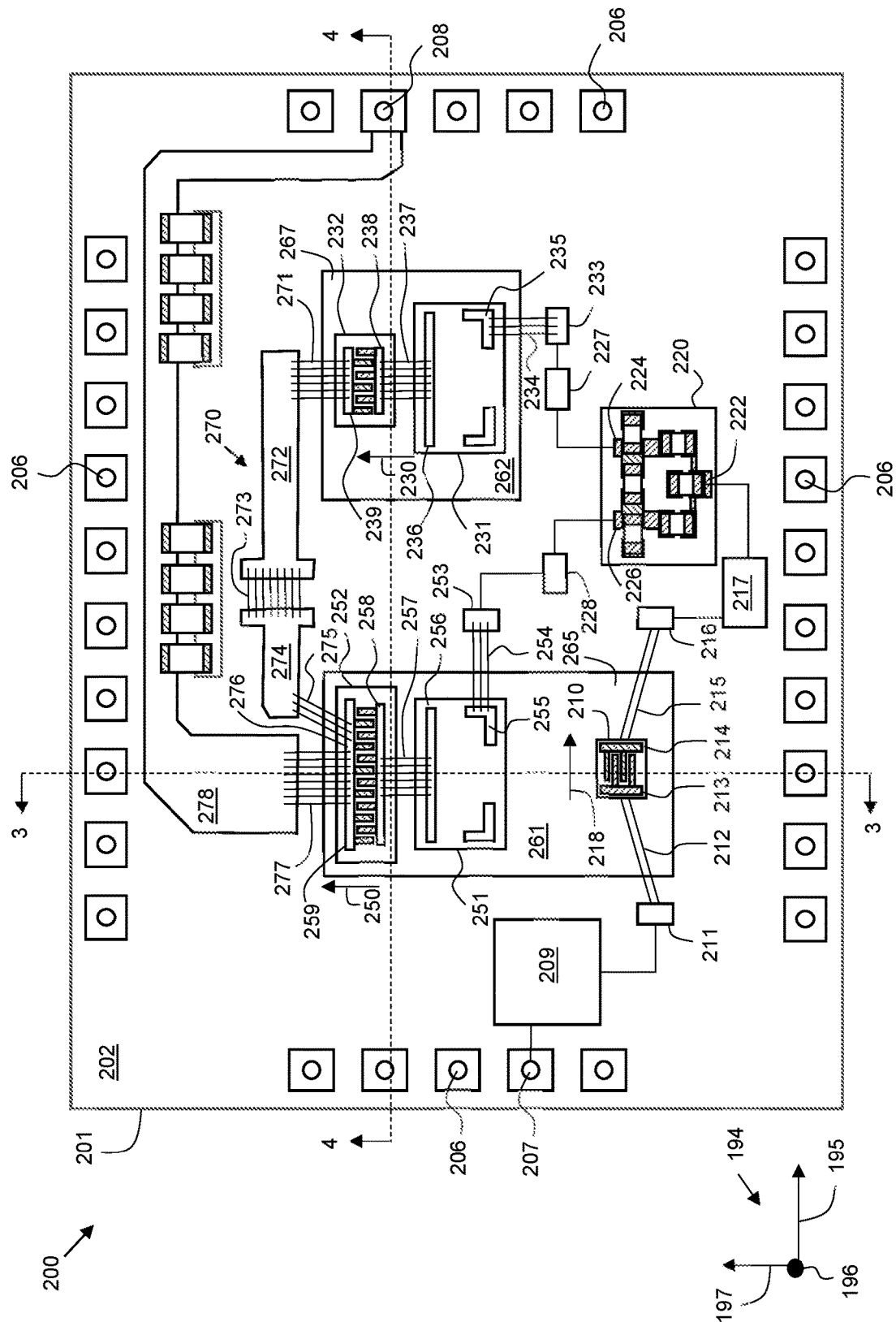
FIG. 2 is a top view of a power amplifier module that embodies the Doherty power amplifier of FIG. 1, in accordance with an example embodiment.

Power amplifier module 100 essentially includes a multiple-stage Doherty amplifier implemented on a module substrate 101 (e.g., module substrate 201, FIG. 2). The Doherty amplifier includes an RF input terminal 107, an RF output terminal 108, a driver amplifier path 118 with a driver amplifier die 110 (e.g., die 210, FIG. 2), a power splitter 120, a carrier amplifier path 130 with a final stage carrier amplifier die 132 (e.g., die 232, FIG. 2), a peaking amplifier path 150 with a peaking amplifier die 152 (e.g., die 252, FIG. 2), a phase shift and impedance inversion circuit 170, and a combining node 176, in an embodiment.

As will be discussed in more detail later, each of the RF input terminal 107 and RF output terminal 108 may be implemented with an embodiment of a device terminal (e.g., terminals 206, 207, 208, FIG. 2), in an embodiment. In addition, power amplifier module 100 also includes one or more ground terminals, which are configured to provide an external ground reference to various components of the module 100.

When incorporated into a larger RF system, the RF input terminal 107 is coupled to an RF signal source, and the RF output terminal 108 is coupled to a load 190 (e.g., an antenna or other load). The RF signal source provides an input RF signal, which is an analog signal that includes spectral energy that typically is centered around one or more carrier frequencies. Fundamentally, the Doherty amplifier is configured to amplify the input RF signal, and to produce an amplified RF signal at the RF output terminal 108.

According to an embodiment, the input RF signal received at the RF input terminal 107 is first amplified through the driver amplifier path 118. The driver amplifier path 118 includes a driver input matching circuit 109, the driver amplifier die 110, and a driver output matching circuit 117. The driver input matching circuit 109 is coupled between the RF input terminal 107 and an input (e.g., gate terminal) of the driver amplifier die 110, and is configured to transform the gate impedance of the power transistor within die 110 to a more desirably system level impedance (e.g., 50 ohms). The driver amplifier die 110 is configured to amplify the input RF signal received from the input matching circuit 109, in order to produce a pre-amplified RF signal at an output (e.g., drain terminal) of the driver amplifier die 110. The driver output matching circuit 117 is coupled between the output of the driver amplifier die 110 and an input 122 of the power splitter 120, and is configured to perform an impedance transformation between the drain of the power transistor within die 110 and the input 122 of the power splitter 120.

According to an embodiment, the driver input and output matching circuits 109, 117 are coupled to a mounting surface of the module substrate 101 (e.g., surface 202 of substrate 201, FIG. 2). As used herein, the term "mounting surface of the module substrate 101" includes the upper surface of the substrate 101, but excludes the upper surfaces of first and second heat dissipation structures 161, 162, which are described below, and which may be substantially co-planar with the mounting surface of the module substrate 101.

Particularly, whereas the matching circuits 109, 117 are coupled to the mounting surface of the module substrate 101, the driver amplifier die 110 is coupled to a first heat dissipation structure 161 (e.g., structure 261, FIG. 2), which is embedded in the module substrate 101. According to an embodiment, the driver amplifier die 110 is coupled to the first heat dissipation structure 161 so that a signal path through the driver amplifier die 110 extends in a first direction, indicated by arrow 118, that is parallel to a first axis 195 of Cartesian coordinate system 194. As used herein, the term "signal path" refers to the path followed by an RF signal through a circuit or a power amplifier die. For example, a portion of the signal path that traverses through the driver amplifier die 110 extends in the first direction (indicated by arrow 118) between the RF input and output terminals (e.g., terminals 213, 214, FIG. 2) of the driver amplifier die 110. It should be noted here that, in alternate embodiments, all or portions of the driver input and/or output matching circuits 109, 117 may be coupled to the first heat dissipation structure 161.

The power splitter 120 has an input 122 and two outputs 124, 126, in an embodiment. The power splitter input 122 is coupled to the output terminal of the driver amplifier die 110 to receive the pre-amplified RF signal. The power splitter 120 is configured to divide the pre-amplified RF signal received at input 122 into first and second pre-amplified RF signals (or pre-amplified carrier and peaking signals), which are provided to the carrier and peaking amplifier paths 130, 150 through outputs 124, 126, respectively. The power splitter 120 is coupled to the mounting surface of the module substrate 101 (e.g., surface 202 of substrate 201, FIG. 2), in an embodiment.

According to an embodiment, power amplifier module 100 also includes first and second phase shift circuits 127, 128 coupled to the power splitter outputs 124, 126, respectively. The first and second phase shift circuits 127, 128 are configured, in combination, to impart a phase difference (e.g., about a 90 degree phase difference) between the first and second pre-amplified RF signals. For example, a first phase shift element 127 may impart about a −45 degree phase delay to the first pre-amplified RF signal (i.e., to the pre-amplified carrier signal), and a second phase shift element 128 may impart about a +45 degree phase delay to the second pre-amplified RF signal (i.e., to the pre-amplified peaking signal). In an alternate embodiment, a single phase shift element along either the carrier or peaking paths 130, 150 may impart the phase difference between the pre-amplified carrier and peaking signals. According to an embodiment, the phase shift elements 127, 128 are coupled to the mounting surface of the module substrate 101 (e.g., surface 202 of substrate 201, FIG. 2).

In another alternate embodiment, the power splitter 120 may be configured to impart the phase difference between the pre-amplified carrier and peaking signals, and phase shift circuits 127, 128 may be excluded. In such an embodiment, at outputs 124 and 126, the carrier and peaking signals may be about 90 degrees out of phase from each other.

When Doherty amplifier has a symmetrical configuration (i.e., a configuration in which the carrier and peaking amplifier power transistors in dies 132, 152 are substantially identical in size), the power splitter 120 may divide or split the input RF signal received at the input 122 into two signals that are very similar with, in some embodiments, equal power. Conversely, when Doherty amplifier has an asymmetrical configuration (i.e., a configuration in which one of the amplifier power transistors, typically the peaking amplifier transistor, is significantly larger), the power splitter 120 may output carrier and peaking signals having unequal power.

The outputs 124, 126 of the power splitter 120 are connected to the carrier and peaking amplifier paths 130, 150, respectively. The carrier amplifier path 130 is configured to amplify the pre-amplified carrier signal from the power splitter 120, and to provide the resulting amplified carrier signal through a phase shift and impedance inversion circuit 170 to the power combining node 176. Similarly, the peaking amplifier path 150 is configured to amplify the pre-amplified peaking signal from the power splitter 120, and to provide the resulting amplified peaking signal to the power combining node 176. The carrier and peaking amplifier paths 130, 150, in combination with the phase shift and impedance inversion circuit 170, are designed so that the amplified carrier and peaking signals arrive in phase with each other at the power combining node 176.

More specifically, the carrier input matching circuit 131 is coupled between the first output 124 of splitter 120 and an input terminal 138 (e.g., gate terminal) of the carrier amplifier die 132, and is configured to perform an impedance transformation between the output 124 of the power splitter 120 (or the first phase shift element 127) and the gate of the power transistor within die 132. The carrier amplifier die 132 is configured to amplify the pre-amplified carrier signal received from the power splitter 120, in order to produce the amplified carrier signal at an output terminal 139 (e.g., drain terminal) of the carrier amplifier die 132.

Similarly, the peaking input matching circuit 151 is coupled between the second output 126 of splitter 120 and an input terminal 158 (e.g., gate terminal) of the peaking amplifier die 152, and is configured to perform an impedance transformation between the output 126 of the power splitter 120 (or the second phase shift element 128) and the gate of the power transistor within die 152. The peaking amplifier die 152 is configured to amplify the pre-amplified peaking signal received from the power splitter 120, in order to produce the amplified peaking signal at an output terminal 159 (e.g., drain terminal) of the peaking amplifier die 152.

According to an embodiment, the carrier amplifier die 132 is coupled to a second heat dissipation structure 162 (e.g., structure 262, FIG. 2), which is embedded in the module substrate 101. All or portions of the carrier input matching circuit 131 also may be coupled to the second heat dissipation structure 162, as shown, although in other embodiments, all or portions of the carrier input matching circuit 131 are coupled to the mounting surface of the module substrate 101. According to an embodiment, the carrier amplifier die 132 is coupled to the second heat dissipation structure 162 so that a signal path through the carrier amplifier die 132 extends in a second direction, indicated by arrow 130, that is parallel to a second axis 197 of Cartesian coordinate system 194 (i.e., an axis orthogonal to the first axis 195). For example, a portion of the signal path 130 that traverses through the carrier amplifier die 132 extends in the second direction (indicated by arrow 130) between the RF input and output terminals 138, 139 (e.g., terminals 238, 239 FIG. 2) of the carrier amplifier die 132.

According to a further embodiment, the peaking amplifier die 152 is coupled to the first heat dissipation structure 161 (e.g., structure 261, FIG. 2). Accordingly, both the driver amplifier die 110 and the peaking amplifier die 152 are coupled to the same heat dissipation structure 161. Coupling the driver and peaking amplifier dies 110, 152 to the same heat dissipation structure 161 enables a relatively compact module by eliminating the need for separate heat dissipation structures for such dies. It may be noted at this point that the driver and peaking amplifier dies 110, 152 (and accordingly the power transistors integrated within dies 110, 152) are not directly electrically connected, but instead are indirectly electrically connected through circuitry (e.g., the power splitter 220) coupled to the mounting surface 202 of the module substrate 201. All or portions of the peaking input matching circuit 151 also may be coupled to the first heat dissipation structure 161, as shown, although in other embodiments, all or portions of the peaking input matching circuit 151 are coupled to the mounting surface of the module substrate 101.

According to an embodiment, the peaking amplifier die 152 is coupled to the first heat dissipation structure 161 so that a signal path through the peaking amplifier die 152 extends in the second direction, indicated by arrow 150, that is parallel to the second axis 197 of Cartesian coordinate system 194 (i.e., an axis orthogonal to the first axis 195). For example, a portion of the signal path 150 that traverses through the peaking amplifier die 152 extends in the second direction (indicated by arrow 150) between the input and output terminals 158, 159 (e.g., terminals 258, 259 FIG. 2) of the peaking amplifier die 152. Accordingly, whereas both the driver amplifier die 110 and the peaking amplifier die 152 are coupled to the same heat dissipation structure 161, the dies 110, 152 are coupled to the structure 161 in an orthogonal orientation in which the signal paths through the driver amplifier die 110 and the peaking amplifier die 152 extend in orthogonal directions (i.e., the signal path directions through the driver and peaking amplifier dies 110, 152 are offset by 90 degrees from each other). The orthogonal orientations of the driver and peaking amplifier dies 110, 152 reduces any mutual coupling between the driver and peaking amplifier dies 110, 152, and also provides the opportunity to reduce module size by enabling a compact arrangement of the power splitter 120 with respect to the driver, carrier, and peaking amplifier dies 110, 132, 152, the phase shift circuits 127, 128 and the input matching circuits 131, 151.

Each amplifier die 110, 132, 152 includes one or more integrated power transistors, where each power transistor includes a control terminal (e.g., a gate terminal) and first and second current-carrying terminals (e.g., a drain terminal and a source terminal). In a single-stage device, which would include a single power transistor, the control terminal is electrically connected to the input terminal 113, 138, 158, one of the current-carrying terminals (e.g., the drain terminal) is electrically connected to the output terminal 114, 139, 159, and the other current-carrying terminal (e.g., the source terminal) is electrically connected through the first or second heat dissipation structure to the ground reference (or another voltage reference). Conversely, a two-stage amplifier would include two power transistors coupled in series between the input terminal 113, 138, 158 and the output terminal 114, 139, 159.

In addition to the above-described and illustrated components, power amplifier module 100 also may include gate and/or drain bias circuitry (not illustrated in FIG. 1) electrically coupled to the driver amplifier die 110, the carrier amplifier die 132, and the peaking amplifier die 152. The gate and/or drain bias voltages may be provided, for example, to configure each amplifier die 110, 132, 152 in a particular class of operation. For example, according to an embodiment, gate and/or drain bias circuitry coupled to the driver amplifier die 110 may configure die 110 to operate in a class AB mode, while gate and/or drain bias circuitry coupled to the carrier and peaking amplifier dies 132, 152 may be provided to configure the amplifier dies 132, 152 to operate in class AB mode and class C mode, respectively.

The output terminal 139 of the carrier amplifier die 132 is coupled to the power combining node 176 through phase shift and impedance inversion circuit 170, in an embodiment. More specifically, a first end of the phase shift and impedance inversion circuit 170 is connected to the output terminal 139 of the carrier amplifier die 132, and a second end of the phase shift and impedance inversion circuit 170 is connected to the power combining node 176.

According to an embodiment, phase shift and impedance inversion circuit 170 includes one or more transmission lines 172 (e.g., lines 272, 274, FIG. 2) formed on or within the module substrate 101, along with connections 171, 175 between opposite ends of the transmission line(s) 172 and the carrier and peaking output terminals 139, 159. For example, the total electrical length of the phase shift and impedance inversion circuit 170 may be about lambda/4 ($\lambda/4$) (i.e., about 90 degrees) at the fundamental frequency of operation, f0, of the amplifier. Accordingly, the phase shift and impedance inversion circuit 170 is configured to impart about a 90 degree relative phase shift to the amplified carrier signal between the RF output terminal 139 and the power combining node 176 at the fundamental frequency.

According to an embodiment, the output terminal 159 of the peaking amplifier die 152 and the combining node 176 are implemented with a common physical element. More specifically, in an embodiment, the output terminal 159 of the peaking amplifier die 152 is configured to function both as the combining node 176 and as the output terminal 159 of the peaking amplifier die 152. To facilitate combination of the amplified carrier and peaking signals, and as mentioned above, the output terminal 159 (and thus the combining node 176) is connected to the second end of the phase shift and impedance inversion circuit 170. In other embodiments, the combining node 176 may be a separate element from the output terminal 159.

Either way, the amplified carrier and peaking RF signals combine in phase at the combining node 176. The combining node 176 is electrically coupled to the RF output terminal 108 to provide the amplified and combined RF output signal to the RF output terminal 108. In an embodiment, an output impedance matching network 178 between the combining node 176 and the RF output terminal 108 functions to present proper load impedances to each of the carrier and peaking amplifier dies 132, 152. The resulting amplified RF output signal is produced at RF output terminal 108, to which an output load 190 (e.g., an antenna) is connected.

Amplifier is configured so that the carrier amplifier path 130 provides amplification for relatively low level input signals, and both the carrier and peaking amplification paths 130, 150 operate in combination to provide amplification for relatively high level input signals. This may be accomplished, for example, by biasing the carrier amplifier 132 so that the carrier amplifier 132 operates in a class AB mode, and biasing the peaking amplifier 152 so that the peaking amplifier 152 operates in a class C mode.

In the embodiment illustrated in FIG. 1 and described above, phase shift elements 127, 128 impart about 90 degrees of phase difference between the peaking and carrier signals prior to amplification, and phase shift and impedance inversion circuit 170 similarly imparts about 90 degrees of phase shift to the amplified carrier signal so that the amplified carrier and peaking signals may combine in phase at the combining node 176. Such an architecture may be referred to as a traditional Doherty amplifier topology with a non-inverting load network. In an alternate embodiment, a first phase shift element in splitter 120 may impart about 90 degrees of phase shift to the carrier signal prior to amplification, rather than to the peaking signal, and phase shift and impedance inversion circuit 170 may be included instead at the output of the peaking amplifier. Such an alternate architecture may be referred to as a Doherty amplifier topology with an inverting load network. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 176.

FIG. 2 is a top view of a power amplifier module 200 that embodies the Doherty amplifier circuitry of FIG. 1, in accordance with an example embodiment. To enhance understanding, FIG. 2 should be viewed simultaneously with FIGS. 3 and 4, which are cross-sectional, side views of the module 200 of FIG. 2 along lines 3-3 and 4-4, respectively. Essentially, power amplifier module 200 includes a Doherty power amplifier implemented with a multi-layer module substrate 201, a plurality of power transistor dies 210, 232, 252, a power splitter 220, heat dissipation structures 261, 262, and other electrical components. In addition, power amplifier module 200 includes a plurality of terminals (e.g., terminals 206, 207, 208) for conveying signals or bias voltages, or for connecting to ground references, as will be discussed in detail below. Various components of power amplifier module 200 correspond with components depicted in FIG. 1, and it should be noted that corresponding components between FIG. 1 and FIGS. 2-4 have the same last two numerical digits (e.g., components 110 and 210 are corresponding components).

Power amplifier module 200 includes a module substrate 201 (e.g., substrate 101, FIG. 1) in the form of a multiple-layer printed circuit board (PCB) or other suitable substrate. The module substrate 201 has a top surface 202 (also referred to as a "front-side" or "mounting surface") and a bottom surface 203 (also referred to as a "back-side" or "heat dissipation surface"). As used herein, the term "mounting surface 202 of the module substrate 201" includes the upper surface of the substrate 201, but excludes the upper surfaces of first and second heat dissipation structures 261, 262, which may be substantially co-planar with the mounting surface of the module substrate 201.

Figure 3:
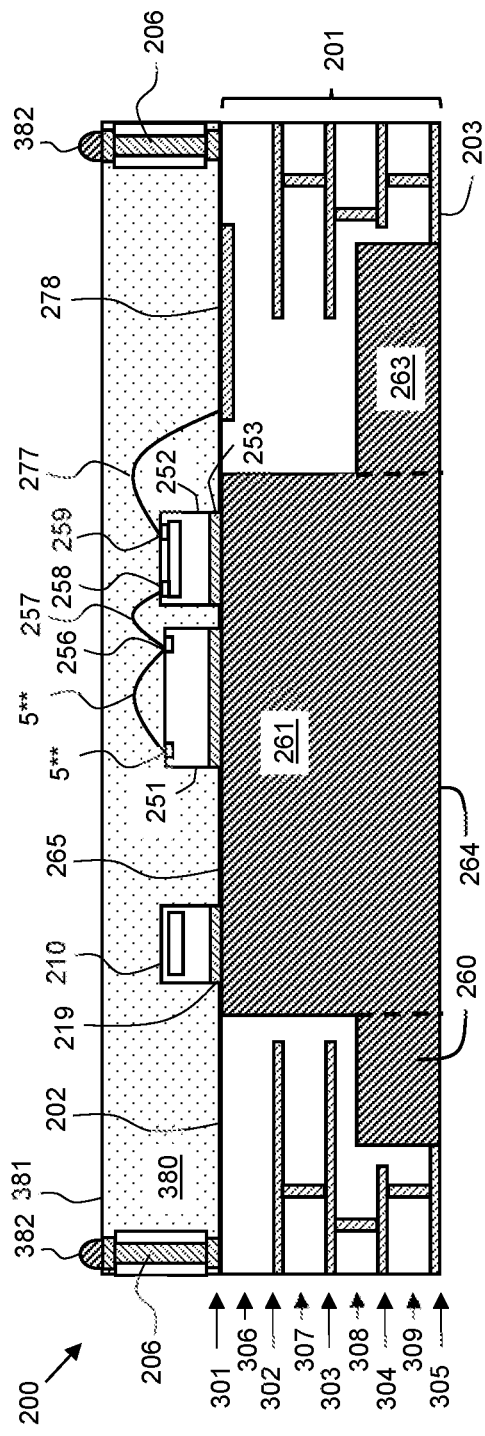
FIG. 3 is a cross-sectional, side view of the power amplifier module of FIG. 2 along line 3-3.

As will be described in more detail below, the terminals 206-208 and a plurality of components are coupled to the mounting surface 202 of the module substrate 201, and the dies 210, 232, 252 are coupled to the heat dissipation structures 261, 262. Non-conductive encapsulant material 380 (e.g., a plastic encapsulant) is disposed on the mounting surface 202 and over and around the components, dies 210, 232, 252, and terminals 206-208 to define a top surface 381 (also referred to as a "contact surface") of the module 200. As shown in FIG. 3, the encapsulant material 380 has a thickness that is greater than the maximum height of the components (e.g., power transistor dies 210, 232, 252) covered by the encapsulant material 380, so that encapsulation material 380 is present between the top surfaces of those components and the top surface 381 of the module.

Figure 7:
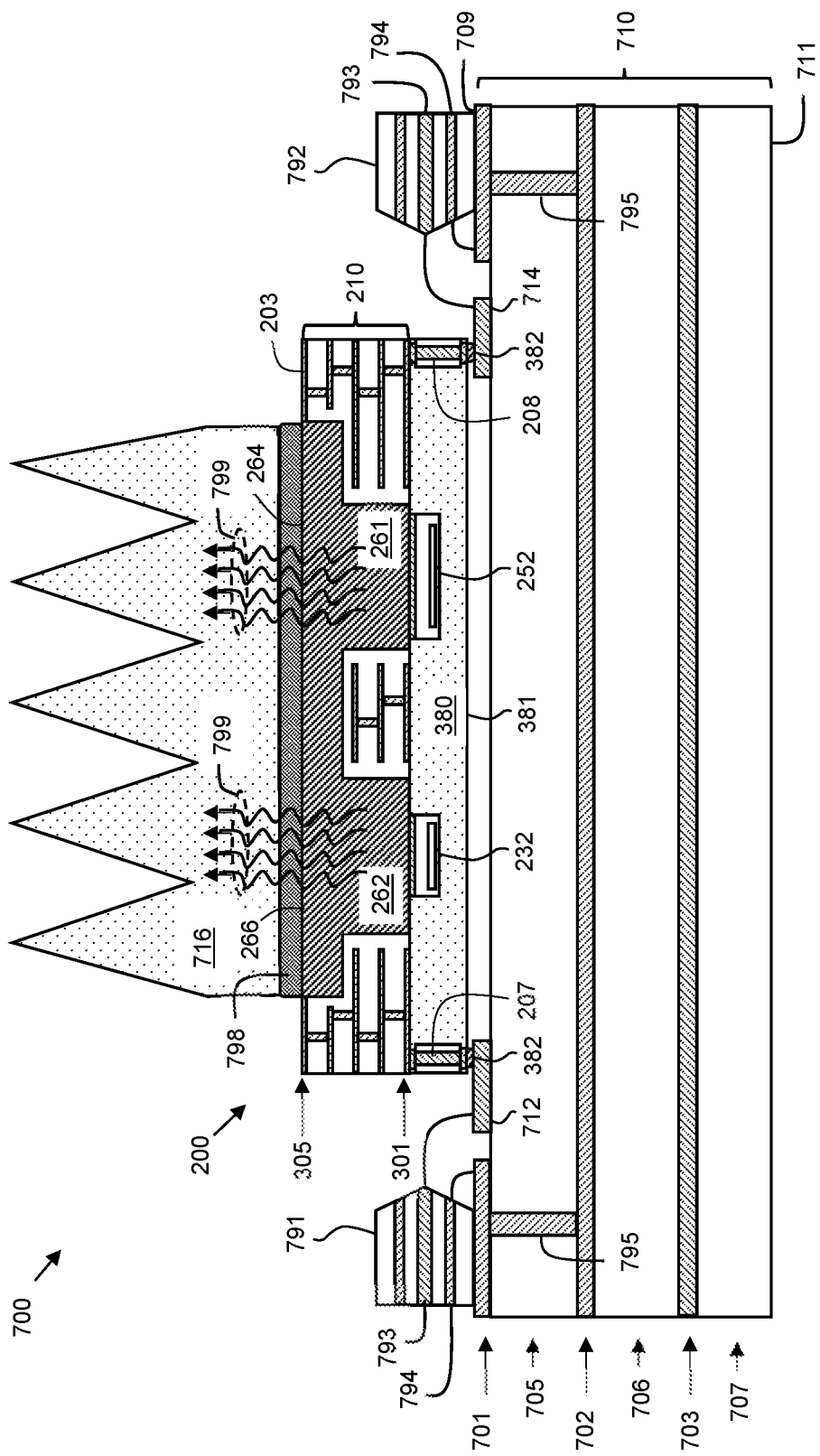
FIG. 7 is a cross-sectional, side view of an amplifier system that includes the power amplifier module of FIG. 2 coupled to a system substrate and a heat sink, in accordance with an example embodiment.

Lower or proximal ends of the terminals 206-208 are coupled to conductive features on the mounting surface 202 of the module substrate 201. Upper or distal ends of the terminals 206-208 are exposed at the contact surface 381 (i.e., terminals 206-208 are exposed at the top surface of the encapsulant material 380). Conductive attachment material 382 (e.g., solder balls, solder paste, or conductive adhesive) is disposed on the exposed distal ends of the terminals 206-208 to facilitate electrical and mechanical attachment of the module 200 to a system substrate (e.g., system substrate 710, FIG. 7), as will be described in more detail later.

Figure 4:
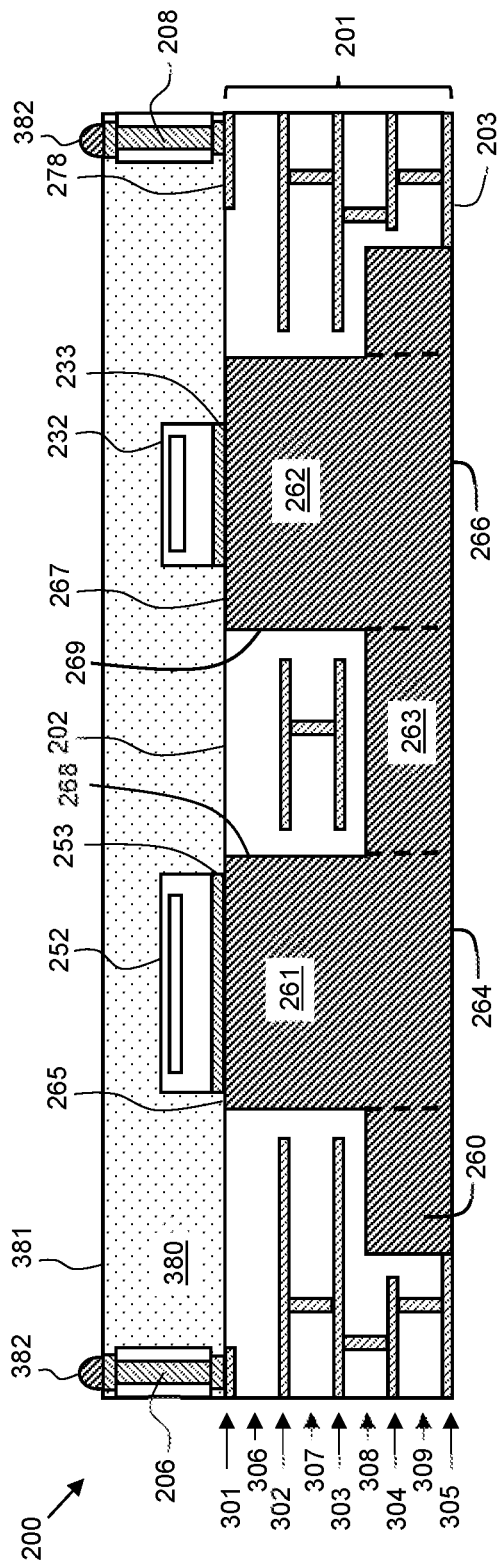
FIG. 4 is a cross-sectional, side view of the power amplifier module of FIG. 2 along line 4-4.

As depicted in FIGS. 3 and 4, the module substrate 201 includes a plurality of dielectric layers 306, 307, 308, 309 (e.g., formed from FR-4, ceramic, or other PCB dielectric materials), in an alternating arrangement with a plurality of conductive layers 301, 302, 303, 304, 305. A top surface 202 of the module substrate 201 is defined by a patterned conductive layer 301, and a bottom surface 203 of the module substrate 201 is defined by a conductive layer 305 and bottom surfaces of the heat dissipation structures 261, 262. In the embodiment illustrated in FIGS. 2 and 3, layers 301 and 305 do not overlie the top and bottom surfaces, respectively, of heat dissipation structures 261, 262. In other embodiments, layer 301 and/or 305 may overlie the top and/or bottom surface of the heat dissipation structures 261, 262, and/or the top and/or bottom surfaces of the heat dissipation structures 261, 262 may be plated. It should be noted that, although module substrate 201 is shown to include four dielectric layers 306-309 and five conductive layers 301-305, other embodiments of a module substrate may include more or fewer dielectric layers and/or conductive layers.

Each of the various conductive layers 301-305 may have a primary purpose, and also may include conductive features that facilitate signal and/or voltage/ground routing between other layers. Although the description below may indicate a primary purpose for each of the conductive layers 301-305, it should be understood that the layers (or their functionality) may be arranged differently from the particular arrangement best illustrated in FIGS. 3 and 4 and discussed below.

For example, in an embodiment, the patterned conductive layer 301 at the mounting surface 202 of the module substrate 201 may primarily function as a signal conducting layer. More specifically, layer 301 includes a plurality of conductive features (e.g., conductive pads and traces) which serve as attachment points for various discrete components, and also provide electrical connectivity between the dies 210, 232, 252 and the other discrete components. In addition, layer 301 may include a plurality of conductive pads that are specifically designated for attachment of electrically conductive signal, bias, and/or ground terminals (e.g., terminals 206-208).

A second patterned conductive layer 302 functions as an RF ground layer, in an embodiment. The RF ground layer 302 also includes a plurality of conductive features (e.g., conductive traces), which may be electrically coupled to conductive features of the signal conducting layer 301 and to a system ground layer 304 (described below) with conductive vias that extend through the dielectric layers 306-309.

Third and fourth patterned conductive layers 303, 304 may function to convey bias voltages to power transistors within the dies 210, 232, 252, and also may function as a routing layer, as mentioned above. Finally, a bottommost or fifth conductive layer 305 functions as a system ground layer and also as a heat sink attachment layer, as will be explained in more detail in conjunction with FIG. 7. In other embodiments, the functional order of the layers 301-305 may be different than that described above.

According to an embodiment, module substrate 201 also includes one or more heat dissipation structures 261, 262, which extend between the top and bottom surfaces 202, 203 of the module substrate 201. In some embodiments, the heat dissipation structures 261, 262 may be joined together by a thermal base structure 263 to form a single integrated thermal structure 260. In such an embodiment, the thermal structure 260 includes the thermal base structure 263 and two pedestals corresponding to the two portions of the heat dissipation structures 261, 262 that extend from the base structure 263 to the mounting surface 202 of the module substrate 201. In an alternate embodiment, heat dissipation structures 261, 262 may be separate structures (e.g., thermal base structure 263 may be excluded), as indicated in FIGS. 3 and 4 with dashed horizontal lines through base structure 263 (i.e., the dashed horizontal lines represent sidewalls of separate heat dissipation structures 261, 262).

Either way, the first heat dissipation structure 261 has a first thermal surface 265 that is exposed at the mounting surface 202 of the module substrate 201, the second heat dissipation structure 262 has a second thermal surface 267 that is exposed at the mounting surface 202 of the module substrate 201, and the first and second thermal surfaces 265, 267 are physically separated by a portion of the mounting surface 202 of the module substrate 201 that is present between the first and second thermal surfaces 265, 267. Sidewalls 268, 269 of the heat dissipation structures 261, 262 are separated by portions of the module substrate 201 (e.g., portions of dielectric layers 306-308, as shown in FIG. 4, or portions of all dielectric layers 306-309 when base structure 263 is excluded). The first and second thermal surfaces 265, 267 may or may not be plated and/or covered by portions of layer 301.

According to an embodiment, driver and peaking amplifier dies 210 and 252 (e.g., dies 110, 152, FIG. 1) are physically and electrically coupled (or connected) to surface 265 of the first heat dissipation structure 261, and carrier amplifier die 232 (e.g., die 132, FIG. 1) is physically and electrically coupled to surface 267 of the second heat dissipation structure 262. The driver and peaking amplifier dies 210 and 252 may be directly connected to the first thermal surface 265, in some embodiments, or a portion of the upper conductive layer 301 and/or a plating layer may be between the dies 210, 252 and the first thermal surface 265. Similarly, the carrier amplifier die 232 may be directly connected to the second thermal surface 266, in some embodiments, or a portion of the upper conductive layer 301 and/or a plating layer may be between the die 232 and the second thermal surface 266.

The driver amplifier die 210 includes a power transistor that is integrally formed within the die 210, and that functions as a driver amplifier. The driver amplifier die 210 has an input terminal 213 coupled to the control terminal (e.g., gate terminal) of the integrated power transistor, and an output terminal 214 that is coupled to the output terminal (e.g., drain terminal) of the integrated transistor. The driver amplifier die 210 is coupled to the first thermal surface 265 so that a first signal path through the driver amplifier die 210 (i.e., a signal path between terminals 213, 214) extends in a first direction, indicated by arrow 218, that is parallel to the first axis 195 of Cartesian coordinate system 194.

Further, the peaking amplifier die 252 includes a power transistor that is integrally formed within the die 252, and that functions as a first final amplifier. The peaking amplifier die 252 has an input terminal 258 coupled to the control terminal (e.g., gate terminal) of the integrated power transistor, and an output terminal 259 that is coupled to the output terminal (e.g., drain terminal) of the integrated power transistor. The peaking amplifier die 252 is coupled to the first thermal surface 265 so that a peaking signal path through the peaking amplifier die 252 (i.e., a signal path between terminals 258, 259) extends in a second direction, indicated by arrow 250, that is parallel to the second axis 197 of Cartesian coordinate system 194. As mentioned previously, coupling the driver and peaking amplifier dies 210, 252 to the same heat dissipation structure 261 enables a relatively compact module by eliminating the need for separate heat dissipation structures for such dies.

Similarly, the carrier amplifier die 232 includes a power transistor that is integrally formed within the die 232, and that functions as a second final amplifier, where the first and second final amplifiers are arranged in parallel with each other. The carrier amplifier die 232 has an input terminal 238 coupled to the control terminal (e.g., gate terminal) of the integrated power transistor, and an output terminal 239 that is coupled to the output terminal (e.g., drain terminal) of the integrated power transistor. The carrier amplifier die 252 is coupled to the second thermal surface 267 so that a carrier signal path through the carrier amplifier die 232 (i.e., a signal path between terminals 238, 239) also may extend in the second direction, indicated by arrow 230, that is parallel to the second axis 197 of Cartesian coordinate system 194. In an alternate embodiment, the carrier amplifier die 232 may be rotated by 90 degrees so that the carrier signal path extends in the first direction (i.e., a direction parallel to the first axis 195).

According to various embodiments, the above-referenced power transistors that are integrally formed within the driver amplifier die 210, the carrier amplifier die 232, and the peaking amplifier die 252 each may be implemented, for example, using a field effect transistor (FET), such as laterally-diffused metal oxide semiconductor (LDMOS) FETs or high electron mobility transistors (HEMTs). For example, the power transistors within the dies 210, 232, 252 each may be implemented with a III-V field effect transistor (e.g., a high electron mobility transistor (HEMT)), such as a gallium nitride (GaN) FET (or another type of III-V transistor, including a GaAs FET, a GaP FET, an InP FET, or an InSb FET). In addition or alternatively, the power transistors within the dies 210, 232, 252 may be implemented with a silicon-based FET (e.g., a laterally diffused metal oxide semiconductor (LDMOS) FET) or a silicon germanium (SiGe) FET, in some embodiments. Further, the semiconductor technology of the driver amplifier die 210, the carrier amplifier die 232, and the peaking amplifier die 252 may be the same, or the driver amplifier die 210 may utilize one semiconductor technology, while the carrier and peaking amplifier dies 232, 252 utilize a different semiconductor technology.

The description and claims may refer to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

As described above and best shown in FIG. 2, the driver amplifier die 210 and the peaking amplifier die 252 are both coupled to the surface 265 of the first heat dissipation structure 261 so that the direction of the signal path through the driver amplifier die 210 is orthogonal to (i.e., angularly offset by 90 degrees) the direction of the signal path through the peaking amplifier die 252. More specifically, a portion of the signal path that traverses through the driver amplifier die 210 extends in the first direction (indicated by arrow 218) between the input and output terminals 213, 214 of the driver amplifier die 210. Conversely, a portion of the signal path that traverses through the peaking amplifier die 252 extends in the second direction (indicated by arrow 250) between the input and output terminals 258, 259 of the peaking amplifier die 252. Accordingly, whereas both the driver amplifier die 210 and the peaking amplifier die 252 are coupled to the same heat dissipation structure 261, the dies 210, 252 are coupled to the structure 261 in an orthogonal orientation in which the signal paths through the driver amplifier die 210 and the peaking amplifier die 252 extend in orthogonal directions (i.e., the signal path directions through the driver and peaking amplifier dies 210, 252, indicated by arrows 218 and 250, respectively, are offset by 90 degrees from each other). As mentioned previously, the orthogonal orientations of the driver and peaking amplifier dies 210, 252 reduces any mutual coupling between the driver and peaking amplifier dies 210, 252, and also provides the opportunity to reduce module size by enabling a compact arrangement of the power splitter 220 with respect to the driver, carrier, and peaking amplifier dies 210, 232, 252, the phase shift circuits 227, 228 and the input matching circuits 231, 251.

The bottom surfaces 264, 266 of the heat dissipation structures 261, 262 and the bottom surface of base structure 263, when included, are exposed at the bottom surface 203 of the module substrate 201. Alternatively, the bottom surfaces 264, 266 of the heat dissipation structures 261-263 may be covered with the bottom conductive layer 305 and/or a plating layer. Either way, the heat dissipation structures 261, 262 are configured to provide a thermal pathway between the dies 210, 232, 252 and the bottom surfaces 264, 266 of the heat dissipation structures 261, 262 (and thus the bottom surface 203 of the module substrate 201).

In some embodiments, and particularly when base structure 263 is excluded, the heat dissipation structures 261, 262 may include separate conductive metallic coins that are press-fit and/or attached into through-holes that extend between the surfaces 202, 203 of the module substrate 201. Alternatively, when base structure 263 is included, structures 261-263 may be integrally formed together and/or machined from a single block of thermally conductive material. Either way, as will be described in more detail in conjunction with FIG. 7, the exposed bottom surfaces 264, 266 of the heat dissipation structures 261, 262 (or the portion of the conductive layer 305 overlying those surfaces 264, 266) may be physically and thermally coupled to a heat sink (e.g., heat sink 716, FIG. 7) when the module 200 is integrated within a larger electrical system.

Now that the general physical construction of module 200 has been described, the amplifier circuitry embedded within module 200 will now be described in additional detail. In particular, the power amplifier module 200 includes an RF signal input terminal 207 (e.g., RF input terminal 107, FIG. 1), a driver amplifier path 218 that includes driver amplifier die 210 (e.g., die 110, FIG. 1), a power splitter 220 (e.g., power splitter 120, FIG. 1), a carrier amplifier path 230 that includes the carrier amplifier die 232 (e.g., die 132, FIG. 1), a peaking amplifier path 250 that includes the peaking amplifier die 252 (e.g., die 152, FIG. 1), a phase shift and impedance inversion circuit 270 (e.g., circuit 170, FIG. 1), a combining node 276 (e.g., combining node 176, FIG. 1), components associated with input and output impedance matching networks, and an RF signal output terminal 208 (e.g., RF output terminal 108, FIG. 1).

Terminal 207 functions as the RF input terminal for the module 200. According to an embodiment, terminal 207 is coupled to an RF signal input pad at the mounting surface 202 of the module substrate 201. Through one or more conductive structures of the substrate 201 (e.g., vias, traces, and/or wirebonds), the RF input terminal 207 is electrically coupled through a driver input matching circuit 209 (e.g., circuit 109, FIG. 1), a conductive pad 211 at the mounting surface 202, and a conductive connection (e.g., wirebonds 212) to the input terminal 213 (e.g., gate terminal) of the driver amplifier die 210. Although not illustrated in detail, input impedance matching circuit 209 may include a plurality of components to implement, for example, a lowpass or bandpass filter in the form of a T-match network or a pi-match network. The plurality of impedance matching circuit components may include, for example, various inductors, capacitors, and/or resistors in the form of discrete components that are mounted to the mounting surface 202 of the module substrate 210. Alternatively, some or all of the plurality of impedance matching components may be incorporated in an integrated passive device (IPD) that is coupled to the mounting surface 202. Embodiments of IPDs will be discussed later in conjunction with FIGS. 5 and 6. However it is implemented, the driver input matching circuit 209 is configured to transform the gate impedance of the power transistor within die 210 to a more desirably system level impedance (e.g., 50 ohms).

The driver amplifier die 210 is configured to amplify the input RF signal received from the input matching circuit 209, in order to produce a pre-amplified RF signal at the output terminal 214 (e.g., drain terminal) of the driver amplifier die 210. Using terminology associated with FETs, the driver amplifier die 210 includes a power transistor with a gate terminal electrically coupled to the input terminal 213, a drain terminal electrically coupled to the output terminal 214, and a source terminal electrically coupled to a conductive layer 219 on a bottom surface of the die 210. Because the conductive layer 219 is connected to the first thermal dissipation structure 261, which in turn may be coupled to ground, the conductive layer 219 may provide a ground node for the source terminal.

As discussed above, the driver amplifier die 210 is coupled to the thermal surface 265 of the first heat dissipation structure 261 so that a first signal path through the driver amplifier die 210 (i.e., a signal path between terminals 213, 214) extends in a first direction, indicated by arrow 218, that is parallel to the first axis 195 of Cartesian coordinate system 194.

A driver output matching circuit 217 (e.g., circuit 117, FIG. 1) is coupled to the output terminal 214 of the driver amplifier die 210 through a conductive connection (e.g., wirebonds 215) and a conductive pad 216 at the mounting surface 202 of the module substrate 201. The driver output matching circuit 217 is configured to perform an impedance transformation between the output terminal 214 of the driver amplifier die 210 and the power splitter 220. As with matching circuit 209, the driver output matching circuit 217 may include a plurality of components (e.g., inductors, capacitors, and/or resistors) in the form of discrete components and/or an IPD mounted to the mounting surface 202 of the module substrate 201.

The power splitter 220 (e.g., splitter 120, FIG. 1) has an input 222 and two outputs 224, 226, in an embodiment. The power splitter input 222, which is coupled to the output terminal 214 of the driver amplifier die 210 through the driver output matching circuit 217, is configured to receive a pre-amplified RF signal from the driver amplifier die 210, and to divide the pre-amplified RF signal received at input 222 into pre-amplified carrier and peaking signals, which are provided to the carrier and peaking amplifier paths 230, 250 through outputs 224, 226, respectively. According to an embodiment, the power splitter 220 includes a plurality of discrete components, as shown, which are coupled to the mounting surface 202 of the module substrate 201. In various alternate embodiments, the power splitter 220 may be implemented with a single splitter device that is coupled to the mounting surface 202.

According to an embodiment, first and second phase shift circuits 227, 228 (e.g., circuits 127, 128, FIG. 1) are coupled to the power splitter outputs 224, 226, respectively. The first and second phase shift circuits 227, 228 are configured, in combination, to impart a phase difference (e.g., about a 90 degree phase difference) between the first and second pre-amplified carrier and peaking signals, as described above in conjunction with FIG. 1. According to an embodiment, the phase shift elements 227, 228 may include discrete components that are coupled to the mounting surface 202 of the module substrate 201. As mentioned previously, in another embodiment, the power splitter 220 may be configured to impart the phase difference between the pre-amplified carrier and peaking signals, and phase shift circuits 227, 228 may be excluded. In such an embodiment, at outputs 224 and 226, the carrier and peaking signals may be about 90 degrees out of phase from each other.

The carrier amplifier path 230 (e.g., carrier amplifier path 130, FIG. 1) includes a carrier input matching circuit (e.g., circuit 131, FIG. 1) and a power transistor integrated within a carrier amplifier die 232. The carrier input matching circuit is coupled between the output 224 of power splitter 220 (and/or phase shift circuit 227) and an input terminal 238 (e.g., gate terminal) of carrier amplifier die 232. According to an embodiment, the carrier input matching circuit is implemented with various inductive connections (e.g., wirebonds 234, 237) and additional components that are integrally formed within a carrier IPD 231.

As shown in FIG. 2, when the carrier input matching circuit includes a carrier IPD 231, both the carrier amplifier die 232 and the carrier IPD 231 may be mounted on the second heat dissipation structure 262. In an alternate embodiment, the carrier amplifier die 232 may be mounted on the second heat dissipation structure 262, and the carrier IPD 231 may be coupled to the mounting surface 202 of the module substrate 201.

However it is implemented, the carrier input matching circuit is configured to transform the impedance between the output 224 of the splitter 220 (or phase shift element 227) and the input terminal 238 of the carrier amplifier die 232. In various embodiments, the carrier input matching circuit may include a plurality of components to implement, for example, a lowpass or bandpass filter in the form of a T-match network or a pi-match network. For example, the carrier input matching circuit may include a first series inductance provided by wirebonds 234 coupled between a conductive pad 233 and an input terminal 235 of carrier IPD 231, a second series inductance provided by wirebonds 237 coupled between an output terminal 236 of IPD 231 and the input terminal 238 of carrier amplifier die 232, and additional components (e.g., one or more shunt capacitances) integrated in IPD 231. According to an embodiment, IPD 231 includes the input bondpad 235, the output bondpad 236, and the above-mentioned integrated component(s) electrically coupled between the input and output bondpads 235, 236. An embodiment of an IPD 500 that may be used for IPD 231 will be described later in conjunction with FIGS. 5 and 6.

Conductive pad 233, which is formed on the mounting surface 202, may be considered the "input" to the carrier input matching circuit, and the distal ends of wirebonds 237 (i.e., the ends that are coupled to terminal 238 of die 232) may be considered the "output" of the carrier input matching circuit. The proximal ends of wirebonds 234 are coupled to conductive pad 233, and the distal ends of wirebonds 234 are coupled to input bondpad 235 of IPD 231. It may be noted here that the direction that wirebonds 234 extend is substantially parallel to the direction of signal flow through carrier amplifier die 232 (i.e., parallel to axis 197 and arrow 230). The proximal ends of wirebonds 237 are coupled to the output bondpad 236 of IPD 231, and the distal ends of wirebonds 237 are coupled to the input terminal 238 of the carrier amplifier die 232.

The carrier amplifier die 232 is configured to receive, at input terminal 238, the pre-amplified carrier signal produced at output 224 of the power splitter 220, and to amplify the pre-amplified carrier signal to produce an amplified carrier signal at the output terminal 239 of the carrier amplifier die 232. Using terminology associated with FETs, the carrier amplifier die 232 includes a power transistor with a gate terminal electrically coupled to the input terminal 238, a drain terminal electrically coupled to the output terminal 239, and a source terminal electrically coupled to a conductive layer 233 on a bottom surface of the die 232. Because the conductive layer 233 is connected to the second thermal dissipation structure 262, which in turn may be coupled to ground, the conductive layer 233 may provide a ground node for the source terminal.

As discussed previously, the carrier amplifier die 232 is mounted to surface 267 of heat dissipation structure 262 so that the signal path through the carrier amplifier die 232 extends in a direction, indicated by arrow 230, that is parallel to axis 197 of Cartesian coordinate system 194, in an embodiment.

The output terminal 239 of the carrier amplifier die 232 is coupled through a phase shift and impedance inversion circuit 270 (e.g., circuit 170, FIG. 1) to a power combining node 276 (e.g., node 176, FIG. 1). According to an embodiment, the phase shift and impedance inversion circuit 270 includes a plurality of elements that are configured to impart about a 90 degree phase shift to the amplified carrier signal between the output terminal 239 of the carrier amplifier die 232 and the power combining node 276. In other words, the total electrical length of the phase shift and impedance inversion circuit 270 may be about lambda/4 ($\lambda$/4) (i.e., about 90 degrees) at the fundamental frequency of operation, f0, of the amplifier. Accordingly, the phase shift and impedance inversion circuit 270 is configured to impart about a 90 degree relative phase shift to the amplified carrier signal between the output terminal 239 and the power combining node 276 at the fundamental frequency.

In an embodiment, circuit 270 includes connections 271 and 275 (e.g., wirebond arrays), and one or more transmission lines 272, 274. Further, in embodiments in which multiple transmission lines are implemented, circuit 270 may include a tuning feature, such as wirebonds 273, that electrically couple transmission lines 272, 274. To tune the circuit 270, the number of wirebonds 273, the wirebond spacing with respect to each other, and their shape (e.g., length, height) may be adjusted to affect the inductance of the array of wirebonds 273, which is connected in series with the transmission lines 272, 274. In the illustrated embodiment, a first connection, in the form of a first set of wirebonds 271, is coupled between the output terminal 239 of the carrier amplifier die 232 and a first end of a first transmission line 272. As second end of the first transmission line 272 is coupled to a first end of tuning wirebonds 273, and a second end of the tuning wirebonds 273 is coupled to a first end of a second transmission line 274. A second end of the second transmission line 274 is coupled through a second set of wirebonds 275 to the power combining node 276. In an alternate embodiment, the tuning wirebonds 273 may be excluded, and a single transmission line may take the place of transmission lines 272, 274 (i.e., a first end of the single transmission line is coupled to wirebonds 271, and a second end of the single transmission line is coupled to wirebonds 275).

Before discussing the power combining node 276 in more detail, the peaking amplifier path 250 will first be described. The peaking amplifier path 250 (e.g., peaking amplifier path 150, FIG. 1) includes a peaking input matching circuit (e.g., circuit 151, FIG. 1) and a power transistor integrated within a peaking amplifier die 252. The peaking input matching circuit is coupled between the output 226 of power splitter 220 (and/or phase shift circuit 228) and an input terminal 258 (e.g., gate terminal) of peaking amplifier die 252. According to an embodiment, the peaking input matching circuit is implemented with various inductive connections (e.g., wirebonds 254, 257) and additional components that are integrally formed within a peaking IPD 251.

As shown in FIG. 2, when the peaking input matching circuit includes a peaking IPD 251, both the peaking amplifier die 252 and the peaking IPD 251 may be mounted on the first heat dissipation structure 261. In an alternate embodiment, the peaking amplifier die 252 may be mounted on the first heat dissipation structure 261, and the peaking IPD 251 may be coupled to the mounting surface 202 of the module substrate 201.

However it is implemented, the peaking input matching circuit is configured to transform the impedance between the output 226 of the splitter 220 (or phase shift element 228) and the input terminal 258 of the peaking amplifier die 252. In various embodiments, the peaking input matching circuit may include a plurality of components to implement, for example, a lowpass or bandpass filter in the form of a T-match network or a pi-match network. For example, the peaking input matching circuit may include a first series inductance provided by wirebonds 254 coupled between a conductive pad 253 and an input bondpad 255 of peaking IPD 251, a second series inductance provided by wirebonds 257 coupled between an output bondpad 256 of IPD 251 and the input terminal 258 of peaking amplifier die 252, and additional components (e.g., one or more shunt capacitances) integrated in IPD 251. According to an embodiment, IPD 251 includes the input bondpad 255, the output bondpad 256, and the above-mentioned integrated component(s) electrically coupled between the input and output bondpads 255, 256. An embodiment of an IPD 500 that may be used for IPD 251 will be described later in conjunction with FIGS. 5 and 6. According to an embodiment, IPD 251 may be identical to or substantially similar to IPD 231.

Conductive pad 253, which is formed on the mounting surface 202, may be considered the "input" to the peaking input matching circuit, and the distal ends of wirebonds 257 (i.e., the ends that are coupled to terminal 258 of die 252) may be considered the "output" of the peaking input matching circuit. The proximal ends of wirebonds 254 are coupled to conductive pad 253, and the distal ends of wirebonds 254 are coupled to input bondpad 255 of IPD 251. It may be noted here that the direction that wirebonds 254 extend is substantially perpendicular to the direction of signal flow through peaking amplifier die 252 (i.e., parallel to axis 195 and perpendicular to arrow 250). The proximal ends of wirebonds 257 are coupled to the output bondpad 256 of IPD 251, and the distal ends of wirebonds 257 are coupled to the input terminal 258 of the peaking amplifier die 252.

In the configuration shown in FIG. 2, the peaking signal path has a 90 degree change in direction through the peaking input matching circuit. More specifically, the direction that wirebonds 254 extend is parallel to axis 195 of Cartesian coordinate system 194, but the signal path takes a 90 degree turn within IPD 251 so that the direction that wirebonds 257 extend is parallel to axis 197 of Cartesian coordinate system 194 (i.e., wirebonds 257 are parallel to axis 197 and arrow 250).

The peaking amplifier die 252 is configured to receive, at input terminal 258, the pre-amplified peaking signal produced at output 226 of the power splitter 220, and to amplify the pre-amplified peaking signal to produce an amplified peaking signal at the output terminal 259 of the peaking amplifier die 252. Using terminology associated with FETs, the peaking amplifier die 252 includes a power transistor with a gate terminal electrically coupled to the input terminal 258, a drain terminal electrically coupled to the output terminal 259, and a source terminal electrically coupled to a conductive layer 253 on a bottom surface of the die 252. Because the conductive layer 253 is connected to the first thermal dissipation structure 261, which in turn may be coupled to ground, the conductive layer 253 may provide a ground node for the source terminal.

As discussed previously, the peaking amplifier die 252 is mounted to surface 265 of heat dissipation structure 261 so that the signal path through the peaking amplifier die 252 extends in a direction, indicated by arrow 250, that is parallel to axis 197 of Cartesian coordinate system 194, in an embodiment.

The output terminal 259 of the peaking amplifier die 252 is co-located with the power combining node 276 (e.g., node 176, FIG. 1), in an embodiment. In other words, the output terminal 259 of the peaking amplifier die 252 and the combining node 276 are implemented with a common physical element. More specifically, in an embodiment, the output terminal 259 of the peaking amplifier die 252 is configured to function both as the combining node 276 and as the output terminal 259 of the peaking amplifier die 252. To facilitate combination of the amplified carrier and peaking signals, and as mentioned above, the output terminal 259 (and thus the combining node 276) is connected to the second end of the phase shift and impedance inversion circuit 270. In other embodiments, the combining node 276 may be a separate element from the output terminal 259. Either way, the amplified carrier and peaking RF signals combine in phase at the combining node 276.

The combining node 276 is electrically coupled to the RF output terminal 208 to provide the amplified and combined RF output signal to the RF output terminal 208. In an embodiment, the combining node is coupled through wirebonds 277 to the proximal end of the output impedance matching network 278, and the distal end of the output impedance matching network 278 is coupled to the RF output terminal 208. The output impedance matching network 278 may include, for example, a transmission line that extends between wirebonds 277 and the RF output terminal 208, along with a plurality of shunt components, not numbered (e.g., capacitances), which are coupled along the transmission line. As discussed in conjunction with FIG. 1, the output impedance matching network 278 functions to present proper load impedances to each of the carrier and peaking amplifier dies 232, 252. The resulting amplified RF output signal is produced at RF output terminal 208.

As discussed previously in conjunction with FIG. 1, the driver amplifier die 210 may be biased to operate in class AB mode. Further, for proper Doherty operation, the carrier amplifier die 232 may be biased to operate in class AB mode, and the peaking amplifier die 252 may be biased to operate in class C mode. To accomplish this biasing, a plurality of gate and drain bias voltages may be provided by external bias voltage sources. According to an embodiment, the bias voltages are provided through various ones of terminals 206 that are allocated to provide bias voltages, along with additional bias circuitry (e.g., decoupling circuitry) on the module substrate 201 that couples the bias terminals 206 to terminals 213, 214, 238, 239, 258, 259 of the power transistor dies 210, 232, 252.

An embodiment of a suitable IPD 500 that may be used for either or both of IPDs 231 and 251 will now be described with reference to FIGS. 5 and 6. IPD 500 may include a base semiconductor substrate 682 (e.g., a silicon substrate, a silicon carbide substrate, a GaN substrate, or another type of semiconductor substrate) and a build-up structure 684 of alternating dielectric and patterned conductive layers, where portions of the patterned conductive layers are electrically connected using conductive vias. Various electrical components of an impedance matching circuit (e.g., components of circuits 131, 151, FIG. 1) are integrally formed within and/or connected to the IPD 500. These electrical components may be electrically connected to conductive input and output bond pads 555-1, 555-2, 556 (e.g., bondpads 235, 236, 255, 256, FIG. 2) at the top surface 502 of the IPD 500, and also may be electrically connected to a conductive layer 686 on a bottom surface 503 of the IPD 500, which serves as a ground node for the IPD 500.

Figure 6:
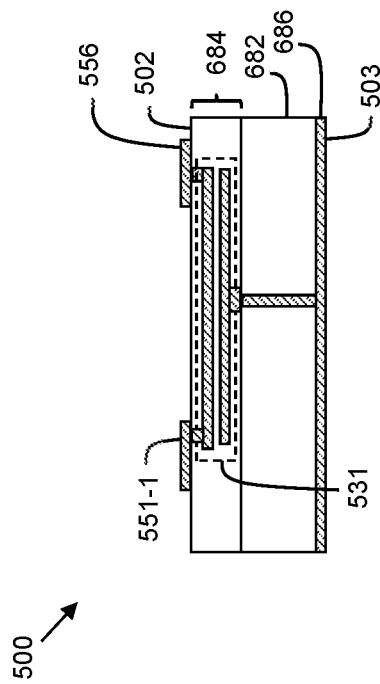
FIG. 6 is a cross-sectional, side view of the IPD of FIG. 5 along line 6-6.
Figure 5:
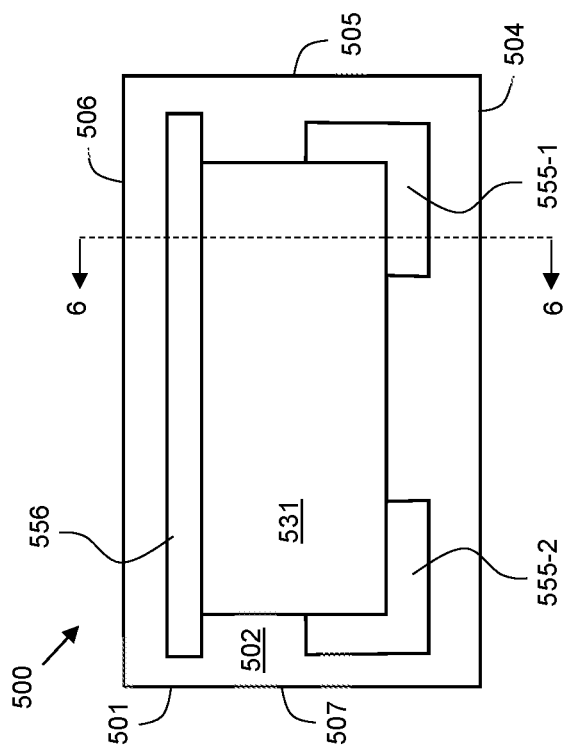
FIG. 5 is a top view of an integrated passive device (IPD) that may be utilized in the power amplifier of FIG. 2, in accordance with an example embodiment.

In the embodiment of FIGS. 5 and 6, the electrical components integrated within IPD 500 include, at least, a shunt capacitor 531, which includes a first terminal/plate coupled to both of the input and output terminals 551-1, 555-2, 556, and a second terminal/plate coupled to the conductive layer 686. In this configuration, when instances of IPD 500 are used for both IPDs 231, 251 (FIG. 2), the capacitor 531 functions as a shunt capacitor in a T-match network that also includes two series inductances provided by wirebond arrays 234 and 237 or 254 and 257. In other embodiments, IPD 500 (and IPDs 231, 251) may include components associated with additional circuits, including but not limited to shunt harmonic termination circuits (e.g., series LC circuits that resonate at a harmonic frequency to shunt energy at the harmonic frequency to ground), shunt baseband impedance circuits (e.g., series LC or RLC circuits), and/or other circuits.

In the illustrated embodiment, IPD 500 is a substantially rectangular device with first, second, third, and fourth sides 504, 505, 506, 507. The input bondpads 551-1, 551-2 each may have an "L-shaped" configuration, in an embodiment, with a first portion of each input bondpad 551-1, 551-2 extending in a direction that is parallel with (and proximate to) the first side 504 of the IPD 500, and with a second portion of each input bondpad 551-1, 551-2 extending in a direction that is parallel with (and proximate to) the second or fourth sides 505, 507, respectively, of the IPD 500. The first and second portions of each input bondpad 551-1, 551-2 are perpendicular to each other, and each portion is configured to function as a bondpad for a single wirebond or a wirebond array.

The L-shaped configuration of the input bondpads 551-1, 551-2 provides design flexibility when the IPD 500 is incorporated into a larger system. For example, as indicated in FIG. 2, IPD 231 represents a first instance of IPD 500, and IPD 251 represents a second instance of IPD 500. The "L-shaped" configuration of the input bondpads 235, 255 enables wirebond arrays that extend in different directions (e.g., arrays 234, 254) to be connected the IPDs 231, 251. For example, still referring to FIG. 2, wirebond array 234 is coupled to a first portion of the L-shaped input bondpad 235 of IPD 231 so that the wirebonds of array 234 extend in a direction parallel to axis 197 of Cartesian coordinate system 194. Conversely, wirebond array 254 is coupled to a second portion of the L-shaped input bondpad 255 of IPD 251 so that the wirebonds of array 254 extend in a direction parallel to axis 195. Accordingly, even though instances of the same IPD 500 are utilized for IPDs 231, 235, the configuration of the input bondpads 551-1, 551-2 enable wirebond arrays 234, 254 that extend in different directions to be coupled to each instance of the IPD 500.

Referring again to FIGS. 2-4, to incorporate embodiments of power amplifier module 200 into a larger electrical system (e.g., a final stage amplifier of a cellular base station), one surface of the power amplifier module 200 is physically and electrically coupled to a system substrate, and a heat sink is attached to the opposite surface of the power amplifier module 200. To illustrate the integration of power amplifier module 200 into such a system, reference is now made to FIG. 7, which is a cross-sectional, side view of an amplifier system 700 that includes the power amplifier module 200 of FIGS. 2-4 coupled to a system substrate 710 and a heat sink 716, in accordance with an example embodiment.

The RF system 700 generally includes the system substrate 710, the power amplifier module 200, and the heat sink 716. According to an embodiment, the system substrate 710 includes a multi-layer printed circuit board (PCB) or other suitable substrate. The system substrate 710 has a top surface 709 (also referred to as a "mounting surface"), and an opposed bottom surface 711. The system substrate 710 also includes a plurality of dielectric layers 705, 706, 707 (e.g., formed from FR-4, ceramic, or other PCB dielectric materials), in an alternating arrangement with a plurality of conductive layers 701, 702, 703, where the top surface 709 of the system substrate 710 is partially defined by a patterned conductive layer 701. It should be noted that, although system substrate 710 is shown to include three dielectric layers 705-707 and three conductive layers 701-703, other embodiments of a system substrate may include more or fewer dielectric layers and/or conductive layers.

Each of the various conductive layers 701-703 may have a primary purpose, and also may include conductive features that facilitate signal and/or voltage/ground routing between other layers. Although the description below indicates a primary purpose for each of the conductive layers 701-703, it should be understood that the layers (or their functionality) may be arranged differently from the particular arrangement best illustrated in FIG. 7 and discussed below.

For example, in an embodiment, the patterned conductive layer 701 at the mounting surface 709 of the system substrate 710 may primarily function as a signal conducting layer. More specifically, layer 701 includes a plurality of conductive features (e.g., conductive pads and traces) which serve as attachment points for module 200, an input RF connector 791, and an output RF connector 792. Each of RF connectors 791, 792 may, for example, be coaxial connectors with a central signal conductor 793 and an outer ground shield 794. According to an embodiment, the signal conductor 793 of RF input connector 791 is electrically coupled to a first conductive trace 712 of layer 701, which in turn is coupled to input terminal 207 of module 200, as described in more detail below. In addition, the signal conductor 793 of RF output connector 792 is electrically coupled to a second conductive trace 714 of layer 701, which in turn is coupled to an output terminal 208 of module 200. The ground shields 794 of connectors 791, 792 are electrically coupled to additional traces (not numbered), which in turn are electrically coupled to a system ground layer 702 of the system substrate 710 through conductive vias 795 that extend between layers 701 and 702.

Module 200 is coupled to the mounting surface 709 of system substrate 710 in an inverted (or "flipped") orientation from the orientation depicted in FIGS. 3 and 4. More specifically, module 200 is coupled to the system substrate 710 so that the contact surface 381 of the module 200 and the mounting surface 709 of the system substrate 710 face each other. In order to connect module 200 to system substrate 710, each of the terminals of module 200 (e.g., terminals 206-208, FIG. 2) are aligned and brought into contact with corresponding pads (e.g., pads 712, 714) on the mounting surface 709 of system substrate 710. In embodiments in which conductive attachment material 382 is disposed on the exposed ends of the module terminals, the conductive attachment material 382 is reflowed or otherwise cured to physically connect the module terminals to their corresponding pads on the mounting surface 709 of the module substrate 710. In other embodiments, conductive attachment material also or alternatively may be disposed on the conductive pads (e.g., pads 712, 714) of the system substrate 710, and an appropriate reflow or curing process may be performed to connect the module 200 to the system substrate 710.

According to an embodiment, a heat sink 716 is physically and thermally coupled to the bottom surface 203 of the power amplifier module 200, and more specifically to the surfaces 264, 266 of the embedded heat dissipation structure (s) 261, 262 of module 200. The heat sink 716 is formed from a thermally-conductive material, which also may be electrically-conductive. For example, the heat sink 716 may be formed from copper or another bulk conductive material. To couple the heat sink 716 to the power amplifier module 200, a thermally conductive material 798 (e.g., thermal grease) may be dispensed on the surfaces 264, 266 of the heat dissipation structures 261, 262 and/or the heat sink 716, and the heat sink 716 may be brought into contact with the surfaces 264, 266. The heat sink 716 may then be clamped, screwed, or otherwise secured in place.

During operation of RF system 700, input RF signals are provided through the RF input terminal 791 and trace/pad 712 to an RF input terminal 207 of the power amplifier module 200. The input RF signals are conveyed through terminal 207 and additional components to the power transistor dies 210, 232, 252, which amplify the input RF signal as discussed previously. The amplified output RF signals are produced at output terminal 208, which is electrically coupled to trace/pad 714, and to the RF output terminal 792.

During operation, significant thermal energy (heat) may be produced by the power transistor(s) within the power transistor dies 210, 232, 252. As indicated by arrows 799, the thermal energy produced by the power transistor dies is conveyed through the heat dissipation structures 261, 262 to the heat sink 716, which effectively dissipates the heat to the ambient atmosphere. Accordingly, the heat dissipation structures 261, 262 convey heat produced by the power transistor dies 210, 232, 252 to the heat sink 716.

Figure 8:
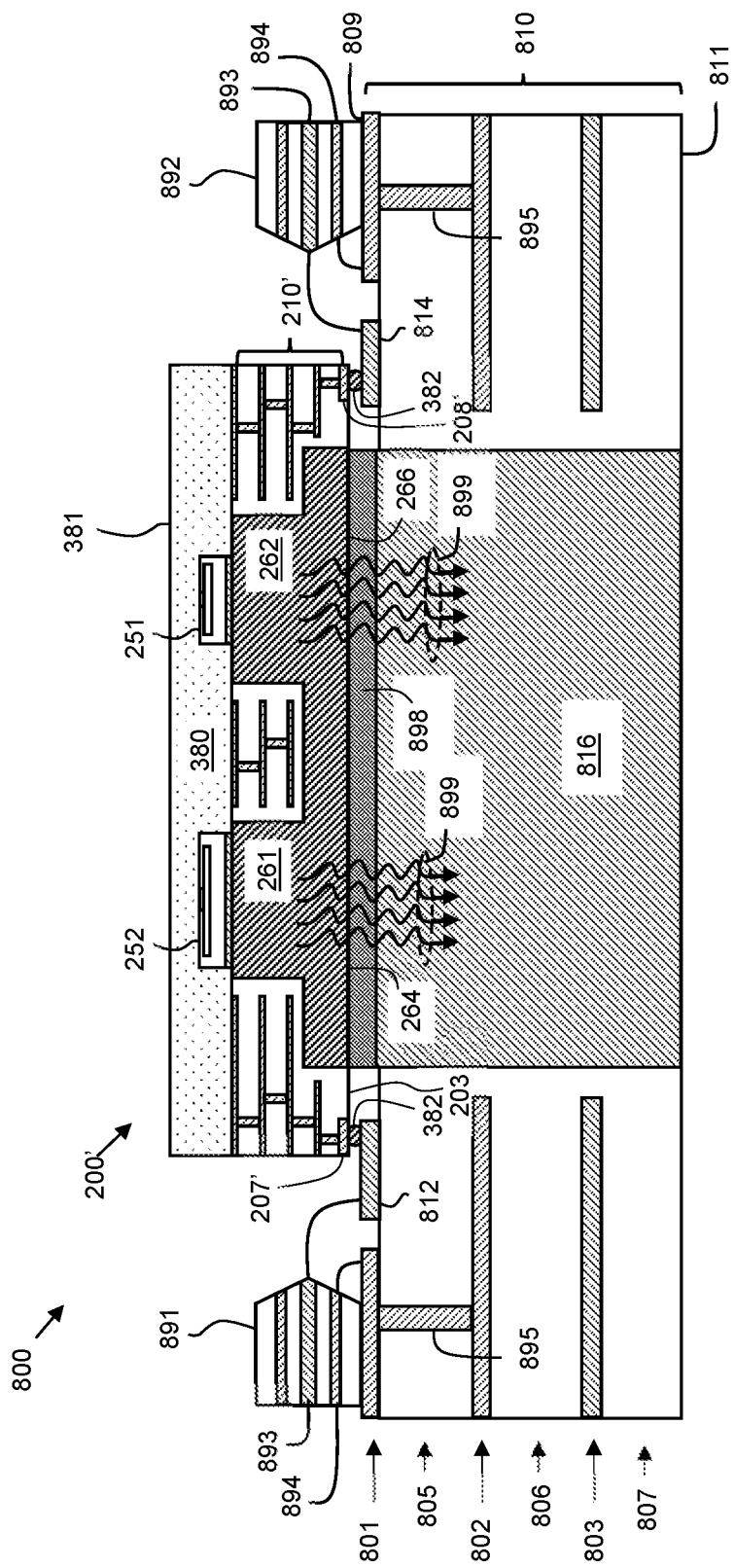
FIG. 8 is a cross-sectional, side view of an amplifier system that includes an alternate embodiment of the power amplifier module of FIG. 2 coupled to a system substrate and a heat sink, in accordance with another example embodiment.

FIG. 8 is a cross-sectional, side view of an amplifier system 800 that includes an alternate embodiment of the power amplifier module 200 of FIG. 2 coupled to a system substrate 810 and a heat sink 816, in accordance with another example embodiment. Specifically, power amplifier module 200' differs from power amplifier module 200 in that power amplifier module 200' does not include terminals 206-208 coupled to the mounting surface 202 of the module substrate 210 as the power amplifier dies 210, 232, 252. Instead, power amplifier module 200' includes RF input and output terminals 207', 208' (and other terminals) exposed at the bottom surface 203' of the module substrate 210' of the power amplifier module 200'. The RF input and output terminals 207', 208' are electrically coupled through the patterned conductive layers of the module substrate 210' to the power amplifier dies 210, 232, 252 of the module 200'. Other than the configuration of the RF input and output terminals 207', 208', the other components of power amplifier module 200' may be substantially identical to the components of power amplifier module 200, and the details described above in conjunction with FIGS. 2-6 apply equally to module 200'.

The RF system 800 generally includes the system substrate 810, the power amplifier module 200', and the heat sink 816. According to an embodiment, the system substrate 810 includes a multi-layer PCB or other suitable substrate.

The system substrate 810 has a top surface 809 (also referred to as a "mounting surface"), and an opposed bottom surface 811. The system substrate 810 also includes a plurality of dielectric layers 805, 806, 807 (e.g., formed from FR-4, ceramic, or other PCB dielectric materials), in an alternating arrangement with a plurality of conductive layers 801, 802, 803, where the top surface 809 of the system substrate 810 is partially defined by a patterned conductive layer 801. It should be noted that, although system substrate 810 is shown to include three dielectric layers 805-807 and three conductive layers 801-803, other embodiments of a system substrate may include more or fewer dielectric layers and/or conductive layers.

Again, each of the various conductive layers 801-803 may have a primary purpose, and also may include conductive features that facilitate signal and/or voltage/ground routing between other layers. Although the description below indicates a primary purpose for each of the conductive layers 801-803, it should be understood that the layers (or their functionality) may be arranged differently from the particular arrangement best illustrated in FIG. 8 and discussed below.

For example, in an embodiment, the patterned conductive layer 801 at the mounting surface 809 of the system substrate 810 may primarily function as a signal conducting layer. More specifically, layer 801 includes a plurality of conductive features (e.g., conductive pads and traces) which serve as attachment points for module 200', an input RF connector 891, and an output RF connector 892. Each of RF connectors 891, 892 may, for example, be coaxial connectors with a central signal conductor 893 and an outer ground shield 894. According to an embodiment, the signal conductor 893 of RF input connector 891 is electrically coupled to a first conductive trace 812 of layer 801, which in turn is coupled to input terminal 207' of module 200', as described in more detail below. In addition, the signal conductor 893 of RF output connector 892 is electrically coupled to a second conductive trace 814 of layer 801, which in turn is coupled to an output terminal 208' of module 200. The ground shields 894 of connectors 891, 892 are electrically coupled to additional traces (not numbered), which in turn are electrically coupled to a system ground layer 802 of the system substrate 810 through conductive vias 895 that extend between layers 801 and 802.

Module 200' is coupled to the mounting surface 809 of system substrate 810 in the same orientation as the orientation depicted in FIGS. 3 and 4. More specifically, module 200' is coupled to the system substrate 810 so that the lower surface of the module substrate 210' and the mounting surface 809 of the system substrate 810 face each other. In order to connect module 200 to system substrate 810, each of the terminals of module 200' (e.g., terminals 207', 208') are aligned and brought into contact with corresponding pads (e.g., pads 812, 814) on the mounting surface 809 of system substrate 810. In embodiments in which conductive attachment material 382 is disposed on the terminals 207', 208', the conductive attachment material 382 is reflowed or otherwise cured to physically connect the module terminals to their corresponding pads on the mounting surface 809 of the module substrate 810. In other embodiments, conductive attachment material also or alternatively may be disposed on the conductive pads (e.g., pads 812, 814) of the system substrate 810, and an appropriate reflow or curing process may be performed to connect the module 200' to the system substrate 810.

According to an embodiment, a heat sink 816 is embedded in the system substrate 810, and when the module 200' is coupled to the system substrate 810, the heat sink 816 is physically and thermally coupled to the bottom surface 203 of the power amplifier module 200', and more specifically to the surfaces 264, 266 of the embedded heat dissipation structures 261, 262 of module 200'. The heat sink 816 is formed from a thermally-conductive material, which also may be electrically-conductive. For example, the heat sink 816 may be formed from copper or another bulk conductive material. To couple the heat sink 816 to the power amplifier module 200', a thermally conductive material 898 (e.g., thermal grease) may be dispensed on the surfaces 264, 266 of the heat dissipation structures 261, 262 and/or the heat sink 816, and the heat sink 816 may be brought into contact with the surfaces 264, 266.

During operation of RF system 800, input RF signals are provided through the RF input terminal 891 and trace/pad 812 to an RF input terminal 207' of the power amplifier module 200'. The input RF signals are conveyed through terminal 207' and additional components to the power transistor dies 210, 232, 252, which amplify the input RF signal as discussed previously. The amplified output RF signals are produced at output terminal 208', which is electrically coupled to trace/pad 814, and to the RF output terminal 892.

During operation, significant thermal energy (heat) may be produced by the power transistor(s) within the power transistor dies 210, 232, 252. As indicated by arrows 899, the thermal energy produced by the power transistor dies is conveyed through the heat dissipation structures 261, 262 to the heat sink 816, which may convey the heat to an additional heat sink (not illustrated) coupled to the bottom surface 811 of the system substrate 810, where the additional heat sink effectively dissipates the heat to the ambient atmosphere. Accordingly, the heat dissipation structures 261, 262 convey heat produced by the power transistor dies 210, 232, 252 to the heat sink 816.

An embodiment of a power amplifier module includes a module substrate, first and second heat dissipation structures, and first, second, and third amplifier dies. The module substrate has a mounting surface and a bottom surface. The first heat dissipation structure extends through the module substrate. A first surface of the first heat dissipation structure is exposed at the mounting surface of the module substrate, and a second surface of the first heat dissipation structure is exposed at the bottom surface of the module substrate. The second heat dissipation structure extends through the module substrate. A first surface of the second heat dissipation structure is exposed at the mounting surface of the module substrate, a second surface of the second heat dissipation structure is exposed at the bottom surface of the module substrate, and the first surface of the first heat dissipation structure and the first surface of the second heat dissipation structure are physically separated by a portion of the mounting surface. The first amplifier die is coupled to the first surface of the first heat dissipation structure. The first amplifier die includes a first power transistor that functions as a driver amplifier. The second amplifier die is coupled to the first surface of the first heat dissipation structure. The second amplifier die includes a second power transistor that functions as a first final amplifier. The third amplifier die is coupled to the first surface of the second heat dissipation structure. The third amplifier die includes a third power transistor that functions as a second final amplifier.

An embodiment of a Doherty power amplifier module includes a module substrate, first and second heat dissipation structures, a driver amplifier die, a peaking amplifier die, a carrier amplifier die, and a power splitter. The module substrate has a mounting surface and a bottom surface. The first heat dissipation structure extends through the module substrate. A first surface of the first heat dissipation structure is exposed at the mounting surface of the module substrate, and a second surface of the first heat dissipation structure is exposed at the bottom surface of the module substrate. The second heat dissipation structure extends through the module substrate. A first surface of the second heat dissipation structure is exposed at the mounting surface of the module substrate, a second surface of the second heat dissipation structure is exposed at the bottom surface of the module substrate. The first surface of the first heat dissipation structure and the first surface of the second heat dissipation structure are physically separated by a portion of the mounting surface. The driver amplifier die is coupled to the first surface of the first heat dissipation structure, and the driver amplifier die includes a first power transistor that functions as a driver amplifier. The power splitter is coupled to the mounting surface of the module substrate, and the power splitter has an input and first and second outputs. The input of the power splitter is coupled to an output of the driver amplifier die. The peaking amplifier die is coupled to the first surface of the first heat dissipation structure, and the peaking amplifier die includes a second power transistor that functions as a peaking amplifier. The second output of the power splitter is coupled to an input of the peaking amplifier die. The carrier amplifier die is coupled to the first surface of the second heat dissipation structure, and the carrier amplifier die includes a third power transistor that functions as a carrier amplifier. The first output of the power splitter is coupled to an input of the carrier amplifier die.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier module comprising: a module substrate with a mounting surface and a bottom surface; a first heat dissipation structure extending through the module substrate, wherein a first surface of the first heat dissipation structure is exposed at the mounting surface of the module substrate, and a second surface of the first heat dissipation structure is exposed at the bottom surface of the module substrate; a second heat dissipation structure extending through the module substrate, wherein a first surface of the second heat dissipation structure is exposed at the mounting surface of the module substrate, a second surface of the second heat dissipation structure is exposed at the bottom surface of the module substrate, and wherein the first surface of the first heat dissipation structure and the first surface of the second heat dissipation structure are physically separated by a portion of the mounting surface; a first amplifier die coupled to the first surface of the first heat dissipation structure, wherein the first amplifier die includes a first power transistor that functions as a driver amplifier; a second amplifier die coupled to the first surface of the first heat dissipation structure, wherein the second amplifier die includes a second power transistor that functions as a first final amplifier; and a third amplifier die coupled to the first surface of the second heat dissipation structure, wherein the third amplifier die includes a third power transistor that functions as a second final amplifier; further comprising an RF input terminal exposed at the bottom surface of the module substrate and electrically coupled to an input terminal of the first amplifier die; and an RF output terminal exposed at the bottom surface of the module substrate and electrically coupled to an output terminal of the second amplifier die.

2. The power amplifier module of claim 1, further comprising:
an RF input terminal coupled to the mounting surface and electrically coupled to an input terminal of the first amplifier die; and
an RF output terminal coupled to the mounting surface and electrically coupled to an output terminal of the second amplifier die.

3. The power amplifier module of claim 2, further comprising:
encapsulant material covering the mounting surface of the module substrate and the first, second, and third amplifier dies, wherein a first surface of the encapsulant material defines a contact surface of the power amplifier module, and distal ends of the RF input terminal and the RF output terminal are exposed at the contact surface.

4. The power amplifier module of claim 1, wherein:
the first and second amplifier dies are coupled to the first surface of the first heat dissipation structure in an orthogonal arrangement.

5. The power amplifier module of claim 1, further comprising:
a power splitter coupled to the mounting surface of the module substrate, wherein an input of the power splitter is coupled to an output of the first power transistor, a first output of the power splitter is coupled to an input of the second power transistor, and a second output of the power splitter is coupled to an input of the third power transistor.

6. The power amplifier module of claim 5, wherein:
the first and second power transistors are not directly electrically connected, but are indirectly electrically connected through a power splitter coupled to the mounting surface of the module substrate.

7. The power amplifier module of claim 5, wherein:
the first, second, and third amplifier dies form portions of a Doherty power amplifier;
the second amplifier die is a peaking amplifier die; and
the third amplifier die is a carrier amplifier die.

8. The power amplifier module of claim 7, further comprising:
a phase shift and impedance inversion circuit coupled between outputs of the second and third amplifier dies.

9. The power amplifier module of claim 1, further comprising:
an input impedance matching circuit that includes an integrated passive device physically coupled to the first heat dissipation structure and electrically coupled to an input of the first amplifier die.

10. The power amplifier module of claim 9, wherein:
the integrated passive device includes an L-shaped bondpad with a first portion extending in a direction that is parallel with a first side of the integrated passive device, and a second portion extending in a direction that is parallel with a second side of the integrated passive device.

11. A Doherty power amplifier module comprising:
a module substrate with a mounting surface and a bottom surface;
a first heat dissipation structure extending through the module substrate, wherein a first surface of the first heat dissipation structure is exposed at the mounting surface of the module substrate, and a second surface of the first heat dissipation structure is exposed at the bottom surface of the module substrate;
a second heat dissipation structure extending through the module substrate, wherein a first surface of the second heat dissipation structure is exposed at the mounting surface of the module substrate, a second surface of the second heat dissipation structure is exposed at the bottom surface of the module substrate, and wherein the first surface of the first heat dissipation structure and the first surface of the second heat dissipation structure are physically separated by a portion of the mounting surface;
a driver amplifier die coupled to the first surface of the first heat dissipation structure, wherein the driver amplifier die includes a first power transistor that functions as a driver amplifier;

a power splitter coupled to the mounting surface of the module substrate, wherein the power splitter has an input and first and second outputs, and wherein the input of the power splitter is coupled to an output of the driver amplifier die;
a peaking amplifier die coupled to the first surface of the first heat dissipation structure, wherein the peaking amplifier die includes a second power transistor that functions as a peaking amplifier, and the second output of the power splitter is coupled to an input of the peaking amplifier die; and
a carrier amplifier die coupled to the first surface of the second heat dissipation structure, wherein the carrier amplifier die includes a third power transistor that functions as a carrier amplifier, and the first output of the power splitter is coupled to an input of the carrier amplifier die.

12. The Doherty power amplifier module of claim 11, wherein:
the driver and peaking amplifier dies are coupled to the first surface of the first heat dissipation structure in an orthogonal arrangement.

13. The Doherty power amplifier module of claim 11, wherein:
the first and second power transistors are not directly electrically connected, but are indirectly electrically connected through the power splitter coupled to the mounting surface of the module substrate.

14. The Doherty power amplifier module of claim 11, wherein:
the first and second heat dissipation structures are joined together by a thermal base structure to form a single integrated thermal structure.

15. The Doherty power amplifier module of claim 11, further comprising:
a phase shift and impedance inversion circuit coupled between outputs of the carrier and peaking amplifier dies; and
a combining node coupled to the phase shift and impedance inversion circuit, wherein the phase shift and impedance inversion circuit is configured so that an amplified carrier signal and an amplified peaking signal combine in phase at the combining node.

16. The Doherty power amplifier module of claim 15, further comprising:
an RF input terminal coupled to the mounting surface and electrically coupled to an input terminal of the driver amplifier die; and
an RF output terminal coupled to the mounting surface and electrically coupled to the combining node.

17. The Doherty power amplifier module of claim 16, further comprising:
encapsulant material covering the mounting surface of the module substrate and the driver, peaking, and carrier amplifier dies, wherein a first surface of the encapsulant material defines a contact surface of the Doherty power amplifier module, and distal ends of the RF input terminal and the RF output terminal are exposed at the contact surface.

18. The Doherty power amplifier module of claim 11, further comprising:
an RF input terminal exposed at the bottom surface of the module substrate and electrically coupled to an input terminal of the first amplifier die; and
an RF output terminal exposed at the bottom surface of the module substrate and electrically coupled to an output terminal of the second amplifier die.

19. The Doherty power amplifier module of claim 11, further comprising:
 a peaking input impedance matching circuit that includes an integrated passive device physically coupled to the first heat dissipation structure and electrically coupled between the second output of the power splitter and the input of the peaking amplifier die.

* * * * *